United States Patent
Ano

(10) Patent No.: US 7,154,166 B2
(45) Date of Patent: Dec. 26, 2006

(54) LOW PROFILE BALL-GRID ARRAY PACKAGE FOR HIGH POWER

(75) Inventor: Kazuaki Ano, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 982 days.

(21) Appl. No.: 09/930,361

(22) Filed: Aug. 15, 2001

(65) Prior Publication Data

US 2003/0034553 A1    Feb. 20, 2003

(51) Int. Cl.
    *H01L 23/538* (2006.01)
(52) U.S. Cl. .................. 257/676; 257/707
(58) Field of Classification Search ............ 257/676, 257/677, 675, 690, 778, 784, 673, 773, 672, 257/707, E23.037; 438/122, 123, 126
See application file for complete search history.

(56) References Cited

U.S. PATENT DOCUMENTS

| | | | | |
|---|---|---|---|---|
| 5,075,760 | A * | 12/1991 | Nakashima et al. | 257/668 |
| 5,583,377 | A * | 12/1996 | Higgins, III | 257/707 |
| 5,594,234 | A * | 1/1997 | Carter et al. | 257/676 |
| 5,888,849 | A * | 3/1999 | Johnson | 438/108 |
| 6,124,637 | A * | 9/2000 | Freyman et al. | 257/692 |
| 6,194,781 | B1 * | 2/2001 | Ikegami | 257/737 |
| 2002/0066592 | A1 * | 6/2002 | Cheng | 174/260 |
| 2002/0079572 | A1 * | 6/2002 | Khan et al. | 257/707 |

FOREIGN PATENT DOCUMENTS

JP    06177316 A  *  6/1994

* cited by examiner

*Primary Examiner*—Kenneth Parker
*Assistant Examiner*—Matthew C Landau
(74) *Attorney, Agent, or Firm*—Wade James Brady, III; Frederick J. Telecky, Jr.

(57) ABSTRACT

A low-profile, high power ball grid array, or land grid array, device including a plastic tape having first and second surfaces, a portion of the first surface covered with an adhesive layer. First and second openings are stamped through the tape and adhesive layer, the first openings configured for solder balls and the second openings configured to accommodate circuit chips. A copper foil is laminated on the adhesive layer, and the portion of this copper foil in the second openings is mechanically shaped into a position coplanar with the second surface, whereby it becomes useable as a chip mount pad, exposed after encapsulation for low resistance heat dissipation. The circuit chips are mounted by means of a thermally conductive material on each of the chip mount pads. Encapsulating material surrounds the mounted chips in low profile. For ball grid array devices, solder balls are attached to the copper foil exposed by the first openings in the tape.

20 Claims, 4 Drawing Sheets

LOW PROFILE BALL-GRID ARRAY PACKAGE FOR HIGH POWER

FIELD OF THE INVENTION

The present invention is related in general to the field of electronic systems and semiconductor devices and more specifically to the structure and fabrication method of thin ball-grid array devices which are intended for high power operation.

DESCRIPTION OF THE RELATED ART

Power semiconductor devices and other integrated circuit devices which dissipate high power, or are used in high frequency telecommunications, have been prepared in the past using an exposure to the ambient of part of their leadframe to dissipate heat produced by the devices, and to provide electrical RF ground for the device. Such approaches are described in U.S. Pat. No. 5,594,234, issued Jan. 14, 1997 (Carter et al., "Downset Exposed Die Mount Pad Leadframe and Package") and U.S. Pat. No. 6,072,230, issued Jun. 6, 2000 (Carter et al., "Exposed Leadframe for Semiconductor Packages and Bend Forming Method of Fabrication"), to which this invention is related.

Semiconductor devices produced with this known technology are typically based on leadframes which include a first plurality of segments in a first horizontal plane and a chip mount pad in a second horizontal plane such that the distance between these two planes is relatively short and can be bridged by a second plurality of segments without difficulty.

In contrast to semiconductor devices with leadframes, the growing family of devices based on solder ball surface mounting called ball grid array devices, does not use leadframes prefabricated from a sheet of metal. Rather, ball grids array devices use plastic substrates or plastic films, integral with electrically conductive lines, to assemble the chips, distribute signals and power, and connect to components. The use of plastic in the assembly of chips of ball grid array packages makes the dissipation of heat generated by the chips more difficult. As an improvement for enhancing thermal conduction in ball grid array packages for power devices, known technology commonly uses solder balls attached to pads on these plastics directly under the area of the semiconductor chips. However, the thermal conduction remains still unsatisfactory due to the poor thermal characteristics of the plastics available.

An urgent need has, therefore, arisen for a coherent, low-cost method of enhancing the thermal performance of ball grid array packages without the need for additional, potentially expensive features. The package structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The invention describes a low-profile, high power semiconductor device including a plastic tape having first and second surfaces, a portion of the first surface covered with an adhesive layer. First and second openings are stamped through the tape and adhesive layer, the first openings configured for solder balls and the second openings configured to accommodate circuit chips. A copper foil is laminated on the adhesive layer, and the portion of this copper foil in the second openings is mechanically shaped into a position coplanar with the second surface, whereby it becomes useable as a chip mount pad. The circuit chips are mounted by means of a thermally conductive material on each of the chip mount pads. Encapsulating material surrounds the mounted chips.

In one embodiment of the invention, the device is fabricated as a ball grid array package, with solder balls attached to the copper foil exposed by the first openings in the tape. In another embodiment, the device is configured as a land grid array, preferably for attachment by metal studs. In both embodiments, the chips are connected by wire bonding to electrically conductive routing lines formed from the copper foil.

While the invention is applicable to high power devices of any size, it is especially suited for low profile device, in which the required robustness and mechanical rigidity is provided by an encapsulation in molding compound, achieved in a transfer molding process. In these devices, the mounted chips, the bonding wires and at least a portion of the copper foil on the first tape surface are covered by the molding compound.

It is an aspect of the present invention to provide a low-cost method and system for packaging high ball-count ball grid array devices in thin overall profile.

Another aspect of the present invention is to provide a high production throughput by employing high speed processing techniques for tape construction, wire bonding, and solder ball attachment.

Another aspect of the invention is to improve electrical product performance by minimizing parasitic resistances and inductances.

Another aspect of the invention is to provide high quality control and reliability assurance through in-process control at no extra cost.

Another object of the invention is to introduce assembly concepts for thin profiles and reliability which are flexible so that they can be applied to many families of semiconductor products, and are general so that they can be applied to several future generations of products.

Another object of the invention is to minimize the cost of capital investment and the movement of parts and product in the equipment.

These aspects have been achieved by the teachings of the invention concerning design concepts and process flow suitable for mass production. Various modifications have been successfully employed to satisfy different selections of product geometries and materials.

The technical advances represented by the invention, as well as the objects thereof will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 5,594,234, issued Jan. 14, 1997 (Carter et al., "Downset Exposed Die Mount Pad Leadframe and Package"), and U.S. Pat. No. 6,072,230, issued Jun. 6, 2000 (Carter et al., "Exposed Leadframe for Semiconductor Packages and Bend Forming Method of Fabrication").

Figure 1A:
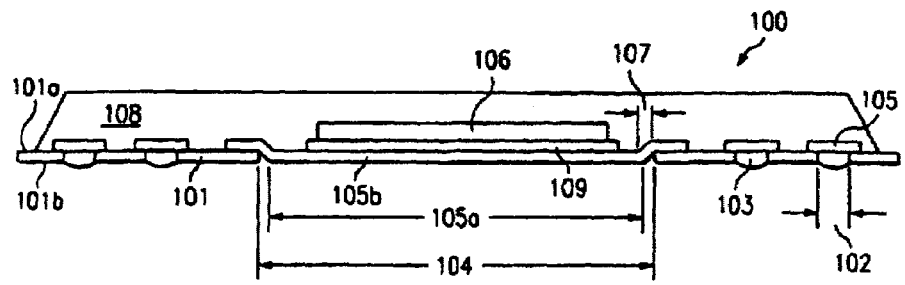
FIG. 1A is a schematic cross section of a low profile high power ball grid array device as an embodiment of the present invention

In the schematic cross section of FIG. 1A, a low profile ball grid array package, generally designated 100, for high power dissipation is shown as an embodiment of the present invention. The device comprises a plastic tape 101, which has a first surface 101a and a second surface 101b. The first surface 101a is at least partially covered with an adhesive layer (not shown on FIG. 1) so that other materials such as a metal foil can be attached to it. As can be seen in FIG. 1A, tape 101 (and the adhesive layer) has a plurality of first openings of diameter 102. These first openings are preferably circular and configured so that each opening can be used for one solder ball 103.

Furthermore, tape 101 has at least one second opening of width 104. This second opening is preferably shaped as a rectangle or a square and has dimensions somewhat larger than the dimensions of the integrated circuit chip 106 of device 100 (more detail in FIG. 2). In the preferred embodiment shown in FIG. 1A, there is only one opening of the second kind; it should be pointed out, though, that in other embodiments of the invention, the tape may have two or more openings of the second kind in order to accommodate multi-chip modules.

A metal foil 105, preferably copper, is laminated on the adhesive layer covering portions of the first surface 101a of tape 101. As can be seen in FIG. 1A, this metal foil 105 covers the first openings of diameter 102 and thus enables the attachment of solder balls 103. A portion of metal foil 105 also covers the second opening of width 104.

Figure 1B:
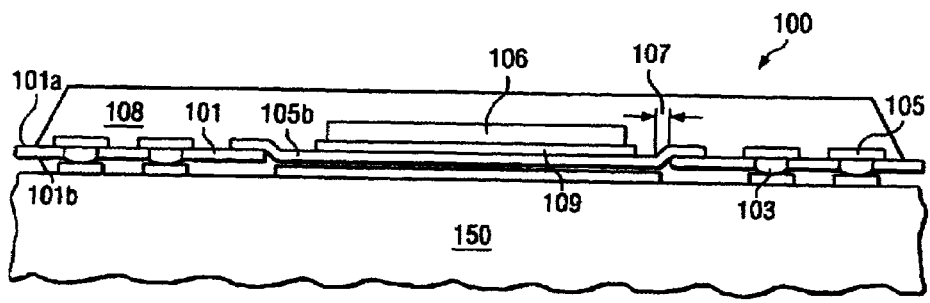
FIG. 1B is a schematic cross section of the device of FIG. 1A attached to a printed circuit board.
Figure 1C:
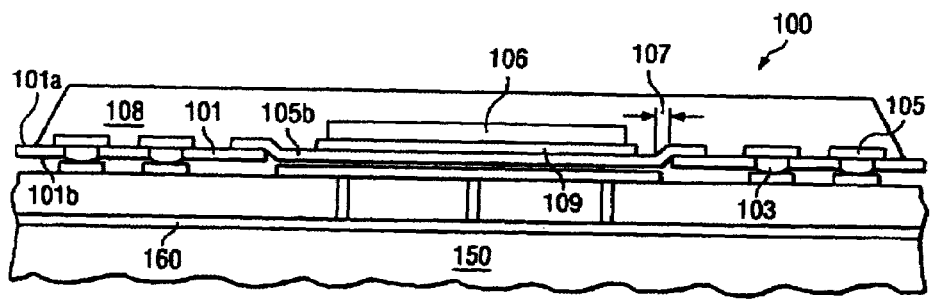
FIG. 1C is a schematic cross section of the device of FIG. 1B attached to a printed circuit board including a heatsink.

It is of pivotal importance for the present invention that the portion 105b of metal foil 105, which overlays the second opening 104, is mechanically shaped (preferably by bending or coining) into a position coplanar with the second surface 101b of the tape 101. Consequently, a metal foil offset 107 is formed around the periphery of opening 104. It is in this position that the portion 105a of metal foil 105 inside of opening 104 serves as mount pad for the integrated circuit chip 106. The foil portion 105a remains exposed after device 100 is encapsulated by encapsulation material 108, and is thus available for direct attachment to a printed circuit board 150, as shown in FIG. 1B. This direct attachment, in turn, minimizes the thermal path, and thus optimizes the heat transport from chip 106 to the printed circuit board and to heat sink 160 as shown in FIG. 1C.

Circuit chip 106 is mounted to chip mount pad 105a by means of a thermally conductive material 109. Mounted chip 106 and major portions of surface 101a of tape 101 are encapsulated by encapsulation material 108. The preferred method of encapsulation is transfer molding, since it is a mature technology, commonly employing an epoxy-based molding compound tailored for well-controlled device contours, rigidity, and reliability. Using the transfer molding technique, the thickness of the molded device can be accurately controlled so that low profiles can be manufactured, which are often required by slim-contour applications (hand-held telephones and other communication equipment, notebook computers, etc.).

Figure 2:
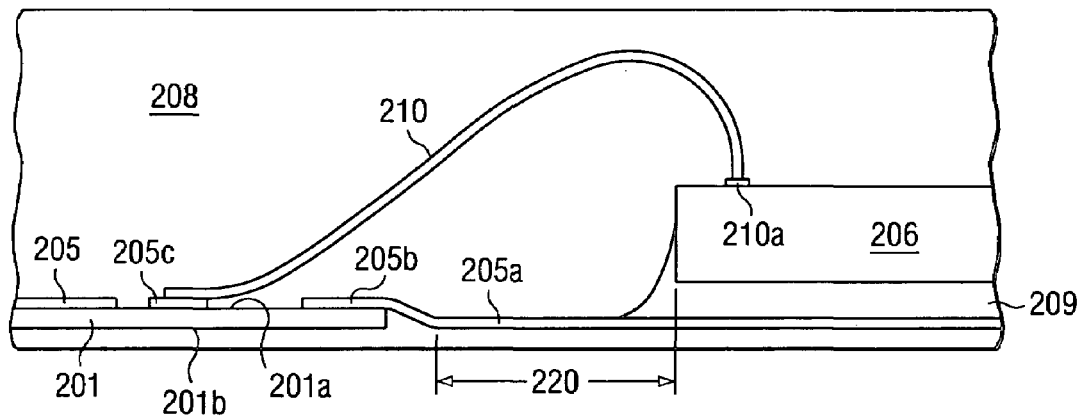
FIG. 2 is a magnified cross section of a portion of an actual device illustrating key features of the present invention.

FIG. 2 is a magnified cross section of a portion of an actual device. The cross section has been located so that specific features of the invention are clearly seen. The tape 201 has a first surface 201a and a second surface 201b. The metal foil is patterned so that it provides a plurality of contact lands 205c. FIG. 2 indicates one of these contact lands to serve as the stitch pad for the stitch of bonding wire 210. The ball 210a of bonding wire 210 is shown as attached to circuit chip 206. As FIG. 2 shows, the stitch pads 205c are supported by tape 201 so that reliable stitch bonds can be fabricated.

FIG. 2 depicts the portion 205b of foil 205, which is to serve as chip mount, secured to the first surface 201a of tape 201. In accordance with the teachings of this invention, the mount pad 205a proper is mechanically formed (by bending) so that mount pad 205a is coplanar with the second surface 201b of tape 201. Due to this "downset", the surface of pad 205a can remain exposed to the outside when the remainder of the device is encapsulated in the encapsulation material 208. It is thus available to be attached directly (preferably by soldering) to an outside part such as a printed circuit board or a heat sink. Alternatively, the exposed surface enables direct heat convection. The thermal resistance is thus minimized and the power performance of the device optimized.

Circuit chip 206 (preferred thickness 220 to 270 μm) is attached to mount pad 205a of the metal foil 205 by means of a thermally conductive material 209 (preferred thickness 70 to 120 μm). This attach material is an epoxy or polyimide, which hardens after polymerization at elevated temperatures. The relatively wide distance 220 from the edge of chip 206 to the "downset" of mount pad 205a is caused by the need to create a large enough peripheral area around the central chip area so that all solder balls can be accommodated in the peripheral area, which are typically placed under the chip in known technology.

Tape 201 is sometimes referred to as "assembly tape", since it enables the assembly of chip 206. The preferred thickness range of plastic tape 201 is 50 to 75 μm. It is commercially available from the companies Shinko, Shindo, Mitsui, Compass, CMK, and Hitachi Cable, all of Japan. Metal foil 205 is preferably made of copper in the thickness range 18 to 25 μm. For high throughput manufacturing, tape 205 preferably has perforations along its periphery so that it can be used in reel-to-reel operations. Some tapes are commercially available with perforations. The tape can further be ordered with an adhesive layer over the first surface of the tape (except between the perforations) for easy lamination of the copper foil after punching the first and second openings described above.

Figure 3A:
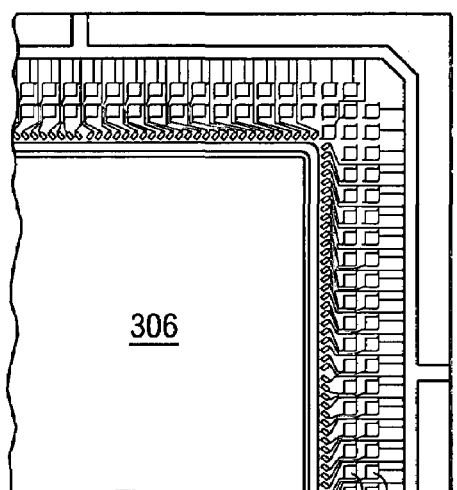
FIG. 3A is a magnified top view of a portion of the mounted chip on a substrate fabricated according to the present invention.
Figure 3B:
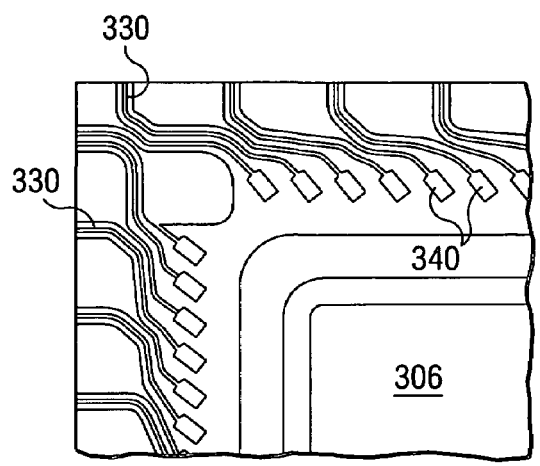
FIG. 3B is a highly magnified top view of a portion of the mounted chip on a substrate fabricated according to the present invention.

FIGS. 3A and 3B are top views of portions of the mounted chip 306 and an embodiment the patterned metal foil on the first surface of the tape. FIG. 3A shows the plurality of contact lands 305, which have the solder balls attached on their underside. FIG. 3B highlights the plurality of electrically conductive routing lines 330 and also shows the pads 340 for attaching the bonding wire stitches. The embodiment of FIGS. 3A and 3B is a MicroStar Power Pad™ device manufactured by Texas Instruments, Japan, having an I/O of 208 "pins" (solder balls), 0.5 mm pitch. In this device, the chip has an area of 9.4 mm² and the package a body outline of 15 mm. The "downset" (offset) of the chip mount pad is 40 µm. Based on the exposed chip mount pad, the thermal impedance of the device is 16° C./W.

Figure 4:
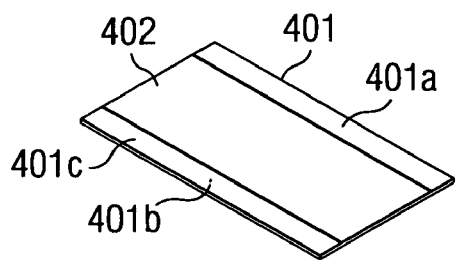
FIGS. 4 to 12 are schematic and simplified perspective views of plastic tape portions illustrating individual process steps in the fabrication flow of the reel-to-reel tape used in the assembly of the semiconductor devices according to the invention.

The perspective views of FIGS. 4 to 12 illustrate schematically the manufacturing process flow of a reel-to-reel tape for high-power ball grid array devices according to the present invention. The fabrication method proceeds in the following significant process steps:

FIG. 4: Providing the base tape 401 having first surface 401a and second surface second surface 401b (not visible in FIG. 4). First surface 401a has an adhesive layer 402 thereon, except for the tape areas 401c along the periphery. Plastic tape 401 may already have perforations for reel-to-reel operations.

Figure 5:
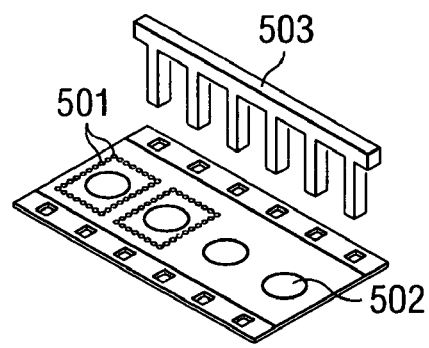

FIG. 5: Punching first and second openings through the tape and the adhesive layer. The first openings 501 are configured for solder balls. The second openings 502 are configured to accommodate the circuit chips of the device. Consequently, the first openings are usually circular, while the second openings are usually rectangular or square-shaped, dependent on the outline of the circuit chip. FIG. 5 shows schematically a punching tool 503.

Figure 6:
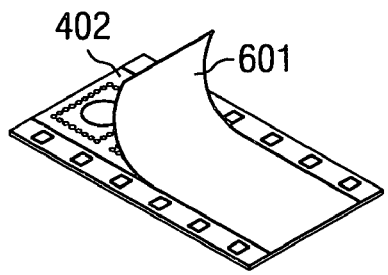

FIG. 6: Laminating a copper foil 601 on the adhesive layer 402, covering both the first and second openings.

Figure 7:
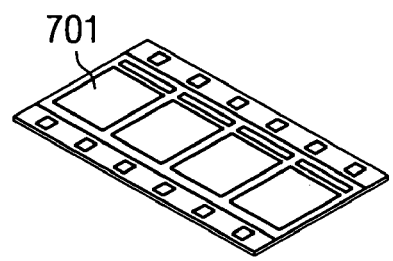

FIG. 7: Coating, exposing and etching a photoresist layer 701, which determines the pattern of the routing lines.

Figure 8:
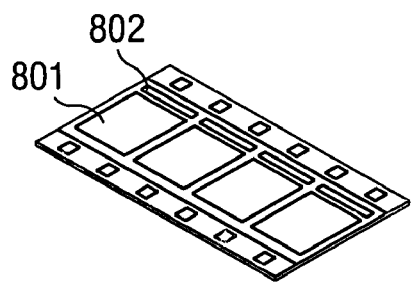

FIG. 8: Chemically etching copper foil 801, thereby creating a plurality 802 of routing lines and contact pads.

Figure 9:
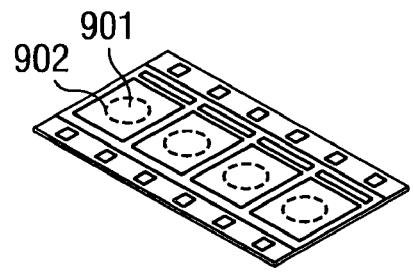

FIG. 9: Mechanically shaping portions of the copper foil into a position coplanar with the second surface (designated 401b in FIG. 4), thus creating a "downset" of the copper foil. The preferred forming technique is coining. The contours of the coined areas 901 are indicated by dashed lines 902 in FIG. 9. These "downset" areas 902 determine the chip attach pads of the devices (usually of rectangular or square geometry).

Figure 10:
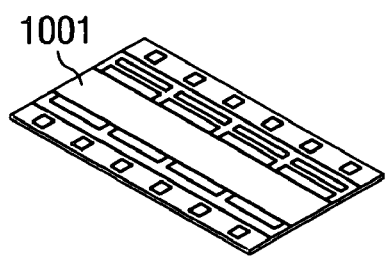

FIG. 10: Protecting a portion of the etched foil with a solder mask 1001.

Figure 11:
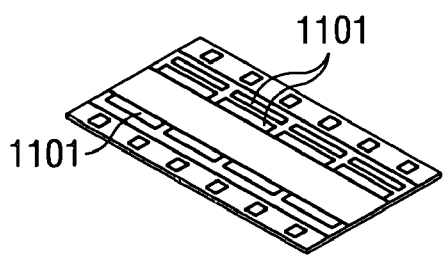

FIG. 11: Plating the exposed portions 1101 of the etched foil with nickel and then with gold.

Figure 12:
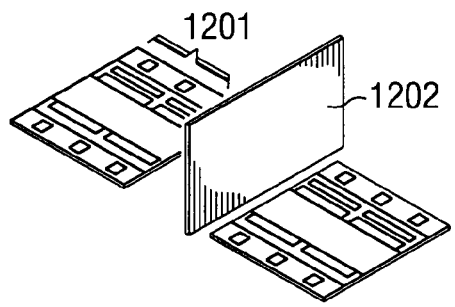

FIG. 12: Singulating individual units 1201 from the original starting tape. A variety of suitable cutting tools 1202 and techniques are available. This process step is optional. The reel-to-reel tape for use in the assembly of high-power ball grid array devices is ready for sheet inspection, packing and shipping.

Figure 13:
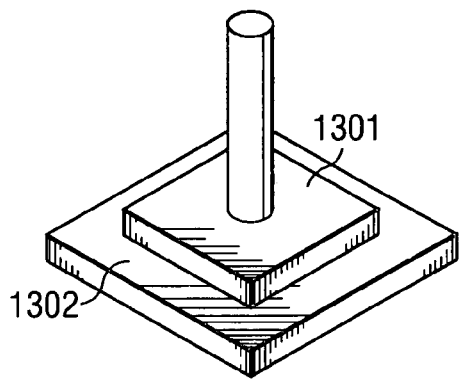
FIGS. 13 to 16 are schematic and simplified perspective views of a chip illustrating individual process steps in the assembly and packaging flow of the chip towards a ball grid array type device, as an example of an embodiment of the invention.

The simplified perspective views of FIGS. 13 to 16 illustrate schematically the manufacturing process flow in the chip assembly and packaging flow towards a ball grid array type device. The fabrication method proceeds in the following significant process steps:

FIG. 13: Mounting a circuit chip 1301 on each of the chip mount pads 1302, prepared as described above in FIGS. 4 to 12.

Figure 14:
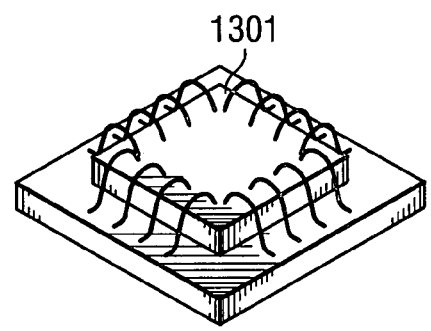

FIG. 14: Wire or ribbon bonding the chips to the routing lines 802 (see FIG. 8). Conventional ball bonding or wedge bonding techniques may be used.

Figure 15:
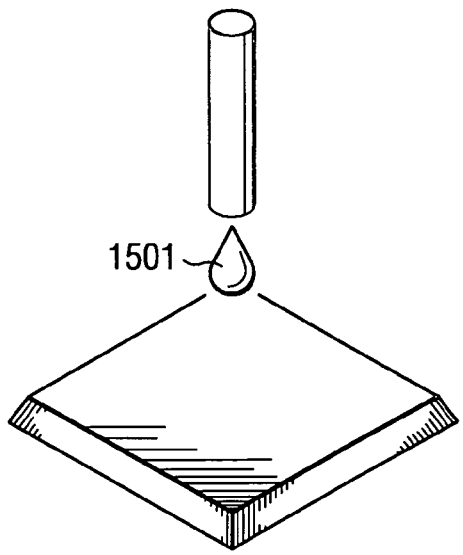

FIG. 15: Encapsulating the first surface of the tape including each of the mounted chips and the bonding wires. The preferred method is conventional transfer molding because of the excellent control of molding compound and device contours, and the resulting possibility of manufacturing low profile devices of good rigidity for high power applications. Alternatively, a conventional potting method using semi-viscous encapsulation material may be employed.

Figure 16:
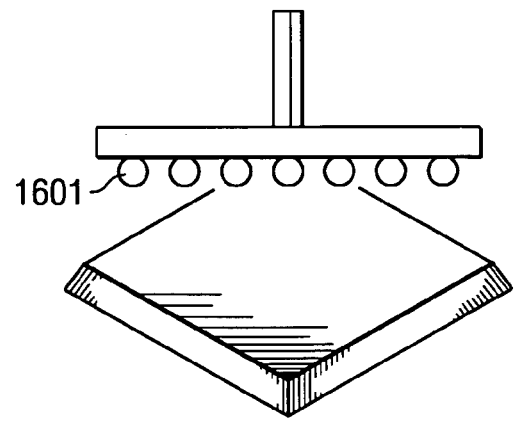

FIG. 16: Attaching solder balls 1601 to the surface of the contact pads exposed by the first tape openings, for ball grid array devices. The solder balls can be selected small enough that, after reflow, they are suitable for low profile devices. Alternatively, land grid array devices may be produced without solder balls.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A reel-to-reel tape, having first and second surfaces, for use in the assembly of semiconductor chips, comprising:
   a plurality of contact lands and a plurality of electrically conductive routing lines integral with said first surface of said tape; and
   a chip mount pad, secured to said first surface, coplanar with said second surface.

2. A reel-to-reel tape, having first and second surfaces and first and second openings, for use in the assembly of semiconductor chips, comprising:
   a plurality of electrically conductive routing lines and a plurality of contact lands on said first surface, covering said first openings in said tape; and
   a chip mount pad in each of said second openings, attached to said first surface and shaped to be coplanar with said second surface.

3. The tape according to claim 2 wherein said routing lines and contact lands are made of copper foil plated with nickel and gold.

4. The tape according to claim 2 wherein said routing lines and contact lands are created by a photolithographic patterning and chemical etch process.

5. The tape according to claim 2 wherein said bending of said chip mount pad is provided by a mechanical coining process.

6. The tape according to claim 2 wherein said first and second openings are created by a mechanical punching process.

7. A low-profile, high power semiconductor device including a plastic tape having first and second surfaces, a portion of said first surface covered with an adhesive layer, comprising:
   first and second openings through said tape and adhesive layer, said first openings configured for solder balls and said second openings configured to accommodate circuit chips;
   a copper foil laminated on said adhesive layer;
   portions of said copper foil in said second openings mechanically shaped into a position coplanar with said second surface, for use as chip mount pads;

circuit chips mounted by means of a thermally conductive material on each of said chip mount pads; and encapsulating material surrounding said mounted chips.

8. A low profile, high power semiconductor device including a plastic tape having first and second surfaces, comprising:
- a plurality of electrically conductive routing lines and a plurality of contact lands on said first surface, said lands exposed by first openings in said tape;
- second openings in said tape configured to accommodate integrated circuit chips;
- a chip mount pad covering each of said second openings, attached to said first surface and shaped to be coplanar with said second surface;
- a circuit chip mounted by means of a thermally conductive material on each of said chip mount pads;
- bonding wires connecting said chip to said contact lands;
- encapsulating material surrounding said first tape surface including each of said mounted chips and said wire bonds; and
- solder balls attached to each of said exposed lands.

9. The semiconductor device according to claim 8 wherein said chip mount pads, coplanar with said second tape surface, provide a direct thermal path to said circuit chips.

10. The semiconductor device according to claim 8 wherein said chip mount pads serve as heat convection surface for said circuit chips.

11. The semiconductor device according to claim 8 wherein said device is created by a transfer molding process of molding compounds, thereby providing mechanical rigidity to said device even when the device thickness is kept to a low profile.

12. A packaged integrated circuit, comprising:
- a substrate having first and second opposing surfaces; said substrate including an opening extending through said substrate from said first surface to said second surface;
- a chip mount pad comprising a sheet of metal, a portion of said sheet of metal on said first surface of said substrate and a portion of said sheet of metal covering said opening such that said portion of said sheet of metal covering said opening is coplanar with said second surface of said substrate, said portion of said sheet of metal covering said opening having first and second opposing surfaces, said second surface of said sheet of metal covering said opening being coplanar with said second surface of said substrate;
- an integrated circuit chip mounted on said first surface of said sheet of metal in said opening.

13. The packaged integrated circuit of claim 12, further comprising encapsulant covering at least a portion of said first surface of said substrate and said chip, wherein said encapsulant does not cover said second surface of said substrate and does not cover said second surface of said sheet of metal covering said opening that is coplanar with said second surface of said substrate.

14. The packaged integrated circuit of claim 13, further comprising a heatsink attached to said second surface of said sheet of metal covering said opening.

15. The packaged integrated circuit of claim 12, wherein said second surface of said sheet of metal covering said opening is attached to a printed circuit board.

16. A packaged integrated circuit chip, comprising:
- a substrate having first and second opposing surfaces; said substrate including an opening extending through said substrate from said first surface to said second surface;
- a chip mount pad of metal foil attached to said first surface of said substrate and downset into and covering said opening such that a bottom surface of said chip mount pad is coplanar with said second surface of said substrate;
- an integrated circuit chip mounted on a top surface of said chip mount pad;
- encapsulation on said first surface of said substrate and not on said second surface of said substrate, such that said encapsulation covers said chip, but does not cover said bottom surface of said chip mount pad.

17. The packaged integrated circuit of claim 16, further comprising a heatsink attached to said bottom surface of said chip mount pad.

18. The packaged integrated circuit of claim 16, wherein said bottom surface of said chip mount pad is attached to a printed circuit board.

19. A packaged integrated circuit chip, comprising:
- a substrate having first and second opposing surfaces; said substrate including an opening extending through said substrate from said first surface to said second surface, said opening having a first size;
- a plurality of contact lands on said first surface of said substrate adjacent to said opening;
- a chip mount pad of metal foil attached to said first surface of said substrate and downset into and covering said opening such that a bottom surface of said chip mount pad is coplanar with said second surface of said substrate;
- an integrated circuit chip mounted on a top surface of said chip mount pad, said integrated circuit chip having a second size, wherein said second size is smaller than said first size;
- bond wires coupling said integrated circuit chip to said contact lands; and
- encapsulation on said first surface of said substrate and not on said second surface of said substrate, such that said encapsulation covers said chip, bond wires, and contact lands, but does not cover said bottom surface of said chip mount pad.

20. The packaged integrated circuit of claim 19, wherein said substrate is plastic tape.

* * * * *